US007611937B2

(12) United States Patent
Lin et al.

(10) Patent No.: US 7,611,937 B2
(45) Date of Patent: Nov. 3, 2009

(54) HIGH PERFORMANCE TRANSISTORS WITH HYBRID CRYSTAL ORIENTATIONS

(75) Inventors: Chung-Te Lin, Tainan (TW); I-Lu Wu, Hsin-Chu (TW); Mariam Sadaka, Austin, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 428 days.

(21) Appl. No.: 11/281,029

(22) Filed: Nov. 17, 2005

(65) Prior Publication Data

US 2006/0292834 A1    Dec. 28, 2006

Related U.S. Application Data

(60) Provisional application No. 60/693,879, filed on Jun. 24, 2005.

(51) Int. Cl.
*H01L 21/336* (2006.01)
*H01L 21/8234* (2006.01)

(52) U.S. Cl. .................. 438/198; 438/150; 438/154; 438/221; 438/222; 438/404; 257/E21.562

(58) Field of Classification Search ............ 438/150, 438/154, 198, 221, 222, 404, 406; 257/64, 257/69, 351, E21.562
See application file for complete search history.

(56) References Cited

U.S. PATENT DOCUMENTS

| | | | |
|---|---|---|---|
| 4,442,448 A | 4/1984 | Shimbo | |
| 4,857,986 A | 8/1989 | Kinugawa | |
| 4,889,829 A | 12/1989 | Kawai | |
| 5,384,473 A | 1/1995 | Yoshikawa et al. | |
| 6,107,125 A | 8/2000 | Jaso et al. | |
| 6,660,588 B1 | 12/2003 | Yang et al. | |
| 6,784,071 B2 | 8/2004 | Chen et al. | |
| 6,815,278 B1 | 11/2004 | Ieong et al. | |
| 6,878,646 B1 | 4/2005 | Tsai et al. | |
| 6,879,000 B2 | 4/2005 | Yeo | |
| 6,902,962 B2 | 6/2005 | Yeo et al. | |
| 6,967,132 B2 | 11/2005 | Gonzalez et al. | |
| 6,972,478 B1 | 12/2005 | Waite et al. | |
| 7,023,055 B2 | 4/2006 | Ieong et al. | |
| 7,208,815 B2 | 4/2007 | Chen et al. | |

(Continued)

OTHER PUBLICATIONS

Yang, M., et al., "High Performance CMOS Fabricated on Hybrid Substrate with Different Crystal Orientations," IEDM, 2003, IEEE, pp. 453-456.

(Continued)

*Primary Examiner*—George Fourson
*Assistant Examiner*—John M Parker
(74) *Attorney, Agent, or Firm*—Slater & Matsil, L.L.P.

(57) ABSTRACT

A method of forming a semiconductor structure having a hybrid crystal orientation and forming MOSFETs having improved performance on the semiconductor structure is provided. The method includes providing a substrate comprising a buried oxide (BOX) on a first semiconductor layer, and a second semiconductor layer on the BOX, wherein the first and second semiconductor layers have a first and a second crystal orientation, respectively, and wherein the substrate comprises a first region and a second region. An isolation structure is formed in the second region extending to the first semiconductor layer. A trench is then formed in the isolation structure, exposing the first semiconductor layer. A semiconductor material is epitaxially grown in the trench. The method further includes forming a MOSFET of a first type on the second semiconductor layer and a MOSFET of an opposite type than the first type on the epitaxially grown semiconductor material.

14 Claims, 6 Drawing Sheets

U.S. PATENT DOCUMENTS

| | | |
|---|---|---|
| 7,268,377 B2 | 9/2007 | Ieong et al. |
| 7,298,009 B2 | 11/2007 | Yan et al. |
| 2004/0256700 A1 | 12/2004 | Doris et al. |
| 2005/0035345 A1 | 2/2005 | Lin et al. |
| 2005/0082531 A1 | 4/2005 | Rim |
| 2006/0073646 A1 | 4/2006 | Yang |
| 2006/0091427 A1* | 5/2006 | Waite et al. ............... 257/213 |
| 2006/0148154 A1 | 7/2006 | Shin et al. |
| 2006/0170045 A1 | 8/2006 | Yan et al. |
| 2006/0194421 A1 | 8/2006 | Ieong et al. |
| 2006/0281235 A1 | 12/2006 | Tayanaka |
| 2006/0284251 A1 | 12/2006 | Hsu et al. |
| 2006/0292770 A1* | 12/2006 | Wu et al. ................. 438/187 |

OTHER PUBLICATIONS

Yang, M., et al., "On the Integration of CMOS with Hybrid Crystal Orientations," 2004 Symposium on VLSI Technology Digest of Technical Papers, IEEE, pp. 160-161.

* cited by examiner

HIGH PERFORMANCE TRANSISTORS WITH HYBRID CRYSTAL ORIENTATIONS

This application claims priority to provisional patent application Ser. No. 60/693,879, filed Jun. 24, 2005, entitled "High Performance Transistors with Hybrid Crystal Orientations," which application is hereby incorporated herein by reference.

TECHNICAL FIELD

The present invention relates to metal oxide semiconductor field effect transistors (MOSFETs), and more particularly to a method of fabricating a semiconductor structure having a hybrid crystal orientation and fabricating MOSFETs on the semiconductor structure.

BACKGROUND

In present semiconductor technology, complementary metal oxide semiconductor (CMOS) devices, such as n-type field effect transistors (FETs) or NFETs, are typically fabricated on semiconductor wafers, such as silicon wafers that have a single crystal orientation, sometimes also referred to as direction. In particular, most of today's semiconductor devices are built on silicon substrates having a (100) crystal orientation.

Electrons are known to have high mobility for a (100) Si crystal orientation, but holes are known to have high mobility for a (110) crystal orientation. Typically, hole mobility values on (100) Si are roughly two times to about four times lower than the corresponding electron mobility for the same crystal orientation. To compensate for this discrepancy, PFETs are typically designed with greater widths in order to balance pull-up currents against the NFET pull-down currents and achieve uniform circuit switching. PFETs having greater widths are undesirable since they occupy a relatively greater amount of chip area. On the other hand, hole mobilities on (110) Si are about two times higher than on (100) Si. Therefore, PFETs formed on a (110) surface will exhibit significantly higher drive currents than PFETs formed on a (100) surface. Unfortunately, electron mobilities on (110) Si surfaces are significantly degraded compared to (100) Si surfaces.

As can be deduced from the above, the (110) Si surface is optimal for PFET devices because of excellent hole mobility, yet such a crystal orientation is inappropriate for NFET devices. Instead, the (100) Si surface is optimal for NFETs.

In view of the above, methods for fabricating integrated semiconductor devices upon a substrate having different crystal orientations have been explored. FIGS. 1 through 4 illustrate cross-sectional views of intermediate stages of a prior art method. The initial substrate includes a substrate 10 having an SOI structure, which includes an insulating layer 14 on a first semiconductor layer 12, and a second semiconductor layer 16 on the insulating layer 14. Preferably, one of the first and the second semiconductor layers is in a (100) direction and the other is in a (110) direction. The substrate 10 includes two regions 22 and 24. A dielectric layer (pad layer) 18 and a mask layer 20 are formed on the substrate 10. Layers 14, 16, 18 and 20 are then removed from the region 24.

As shown in FIG. 2, a spacer 25 is formed to isolate the semiconductor layer 16 in region 22 from the subsequently formed semiconductor layer 26. The semiconductor layer 26 is epitaxially grown in region 24, and thus has the same crystal orientation as the first semiconductor layer 12.

FIG. 3 illustrates the removal of the dielectric layer 18 and the formation of a shallow trench isolation (STI) region 27. The substrate 10 thus has two regions 16 and 26 that have different crystal orientations. Assuming the semiconductor layer 16 is in a (100) orientation and the semiconductor layer 26 is in a (110) orientation, an NFET 36 is then preferably formed on the semiconductor layer 16 and a PFET 38 is formed on the semiconductor layer 26, as illustrated in FIG. 4.

The crystal orientations of the semiconductor layers 16 and 26 are optimal for respective devices 36 and 38, and high performance can be achieved. However, the method suffers drawbacks. Trenches have to be formed in order to form STI regions that isolate devices 36 and 38. However, semiconductor layers 16 and 26 have different etching rates. This posts a challenge for the simultaneous etching process and subsequent chemical mechanical polish for planarizing surfaces. Additionally, the spacer 25 has to be formed to prevent epitaxial growth from the semiconductor layer 16. Since the spacer 25 has to have a minimum thickness so that it will not be completely etched during the cleaning processes, which are performed before growing the semiconductor layer 26, the scalability of the devices on the wafer is reduced.

What is needed, therefore, is a method of fabricating high performance MOSFETs on hybrid substrates with different crystal orientations, without the difficulty of forming STI regions in different regions having different characteristics. Additionally, scalability issues need to be resolved.

SUMMARY OF THE INVENTION

A method of forming a semiconductor structure having a hybrid crystal orientation and forming MOSFETs having improved performance is provided.

In accordance with one aspect of the present invention, the method includes providing a substrate comprising a buried oxide on a first semiconductor layer, and a second semiconductor layer on the buried oxide, wherein the first and second semiconductor layers have a first and a second crystal orientation, respectively. The substrate includes a first region and a second region. A first isolation structure is formed in the second region, extending from a top surface of the substrate into the first semiconductor layer. A first trench is then formed in the first isolation structure, and the first semiconductor layer is exposed through the first trench. A semiconductor material is epitaxially grown in the first trench. In the resulting semiconductor structure, the second semiconductor layer has a different crystal orientation from the epitaxially grown semiconductor material. Preferably, a second isolation structure is formed in the first region simultaneously as the first isolation structure is formed.

In accordance with another aspect of the present invention, the method of forming a semiconductor structure includes providing a substrate comprising a buried oxide (BOX) on a first semiconductor layer, and a second semiconductor layer on the buried oxide, wherein the first and second semiconductor layers have different crystal orientations, respectively. The substrate includes a first region and a second region. A first isolation structure is then formed in the second region extending from the top surface of the substrate to the buried oxide. The method further includes forming a trench in the first isolation structure, so that the first semiconductor layer is exposed through the first trench. A semiconductor material is epitaxially grown in the first trench. Preferably, a second isolation structure is formed in the first region simultaneously as the first isolation structure is formed.

In accordance with yet another aspect of the present invention, the method further includes forming a first MOSFET on the second semiconductor layer in the first region and a second MOSFET on the epitaxially grown semiconductor material, wherein the first and second MOSFETs are of opposite types. In the preferred embodiment, the first and second semiconductor layers are formed of silicon, with one of the first or second semiconductor layers being in a (100) direction, and the other being in a (110) direction. An NFET is preferably formed on the semiconductor material/layer in a (100) direction, and a PFET is preferably formed on the semiconductor material/layer in a (110) direction. The second isolation structure formed in the first region is preferably used for isolating MOSFETs.

By using preferred embodiments of the present invention, the semiconductor devices are more scalable, and the fabrication processes are less complex.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method of forming a hybrid semiconductor structure having a hybrid crystal orientation and forming high performance MOSFETs on the hybrid semiconductor structure is illustrated in FIGS. 5 through 19. Throughout the various views and illustrative embodiments of the present invention, like reference numbers are used to designate like elements.

Figure 1:
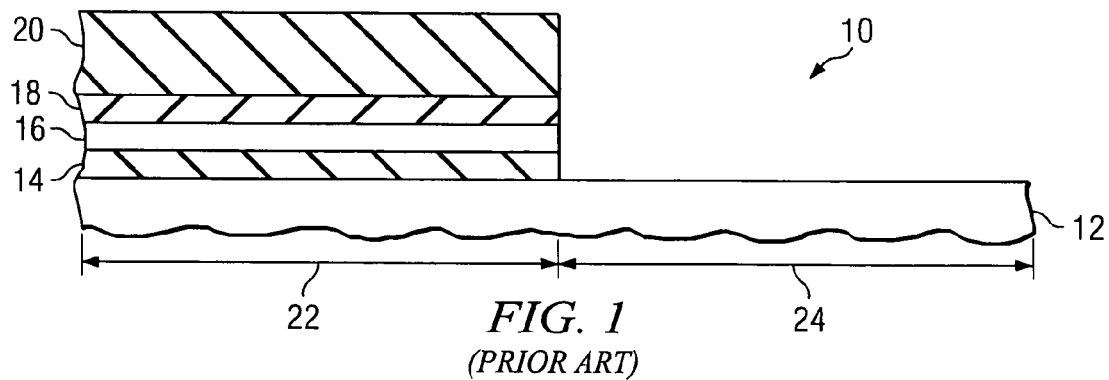
FIGS. 1 through 4 illustrate cross-sectional views of intermediate stages in a conventional method of forming a semiconductor structure having a hybrid crystal orientation.
Figure 2:
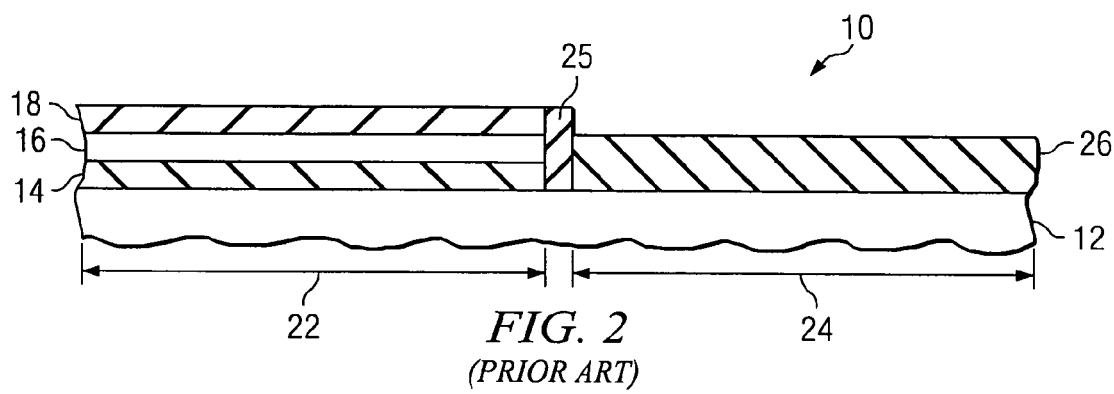
Figure 3:
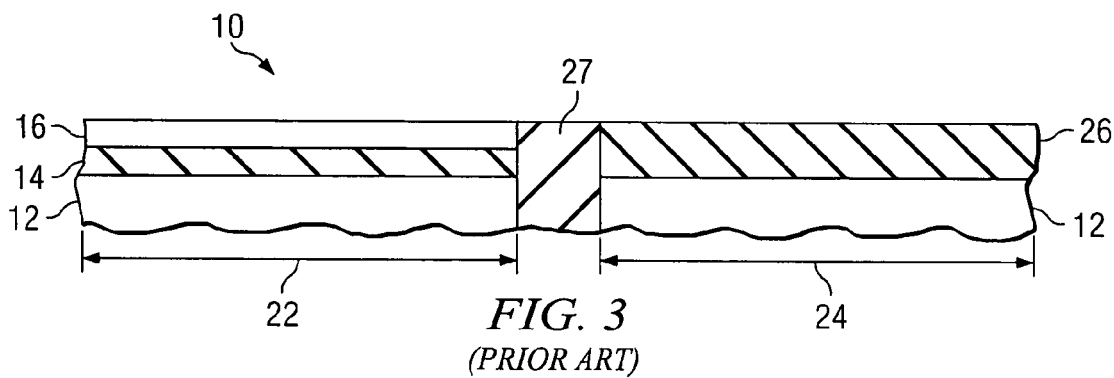
Figure 4:
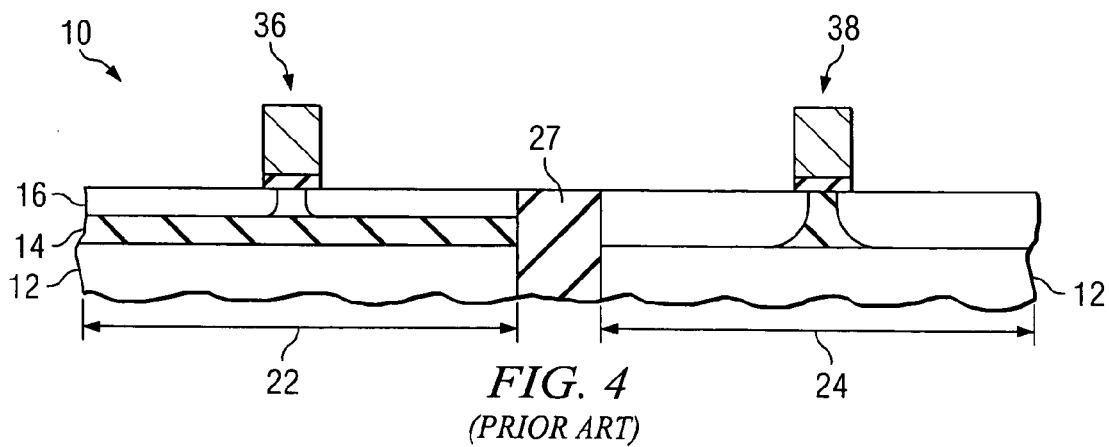
Figure 5:
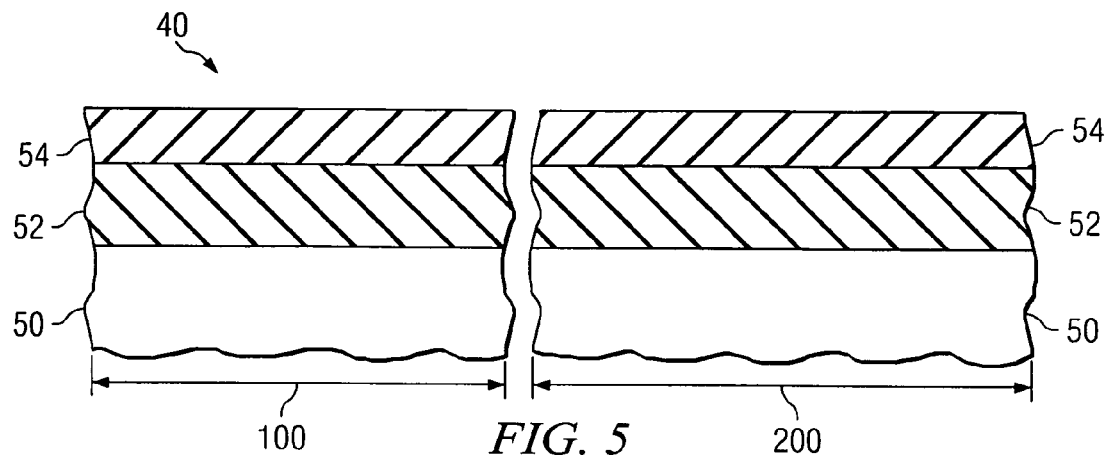
FIGS. 5 through 15 are cross-sectional views of intermediate stages in the manufacture of a preferred embodiment of the present invention.

FIG. 5 illustrates a substrate 40 having a well-known SOI structure. The SOI structure includes a buried oxide (BOX) 52 on a semiconductor layer 50. A semiconductor layer 54 is on the BOX 52. In the preferred embodiment, the semiconductor layer 54 is doped with an impurity according to the type of FET devices that will be subsequently formed thereon. The semiconductor layers 50 and 54 preferably have different crystal orientations. More preferably, one of the semiconductor layers 50 and 54 is formed of crystal silicon in a (100) direction, and the other is formed of crystal silicon in a (110) direction. For simplicity, throughout the description, the semiconductor layer 50 is assumed to be formed of silicon in a (110) direction, and the semiconductor layer 54 is assumed to be formed of silicon in a (100) direction, although they can be formed of other semiconductor materials in appropriate directions.

Preferably, the substrate 40 is formed by bonding two substrates. In an exemplary embodiment, a first substrate includes a first semiconductor layer 50 in a first crystal orientation. An oxide layer 52 is formed on the surface of the second crystal layer. A second substrate includes a second semiconductor layer 54 in a second crystal orientation. The first and second substrates are then bonded with the oxide layer 52 in between. The second semiconductor layer 54 is then thinned, and a structure shown in FIG. 5 is formed.

The substrate 40 includes at least a first region 100 and a second region 200. Each of the regions 100 and 200 may be of different sizes, preferably large enough for forming one or more MOSFETs.

Figure 6:
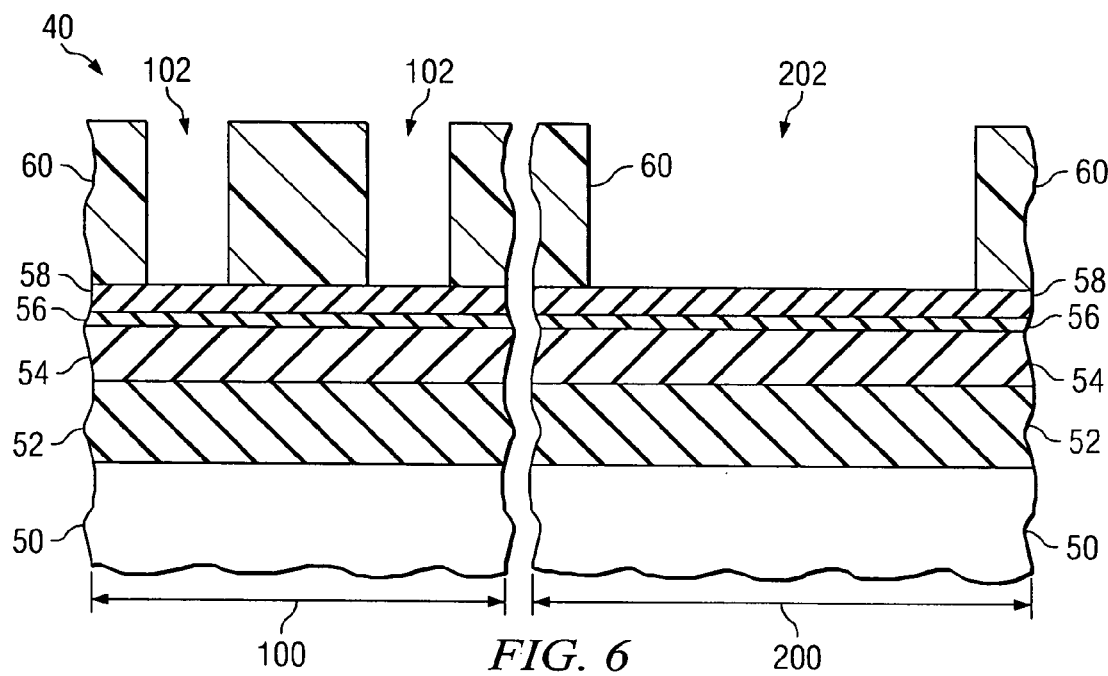

FIG. 6 illustrates the formation of an optional pad layer 56, a (hard) mask layer 58, and a photo resist 60 on the substrate 40. The pad layer 56 is used to buffer the semiconductor layer 54 and the mask layer 58 so that less stress is generated. The pad layer 56 may also act as an etch stop layer for the subsequently formed mask layer 58. In the preferred embodiment, the mask layer 58 is formed of silicon nitride using low-pressure chemical vapor deposition (LPCVD). In other embodiments, the mask layer 58 is formed by thermal nitridation of silicon, plasma enhanced chemical vapor deposition (PECVD) or plasma anodic nitridation using nitrogen-hydrogen. The photo resist 60 is patterned, and openings 102 and 202 are formed.

Figure 7:
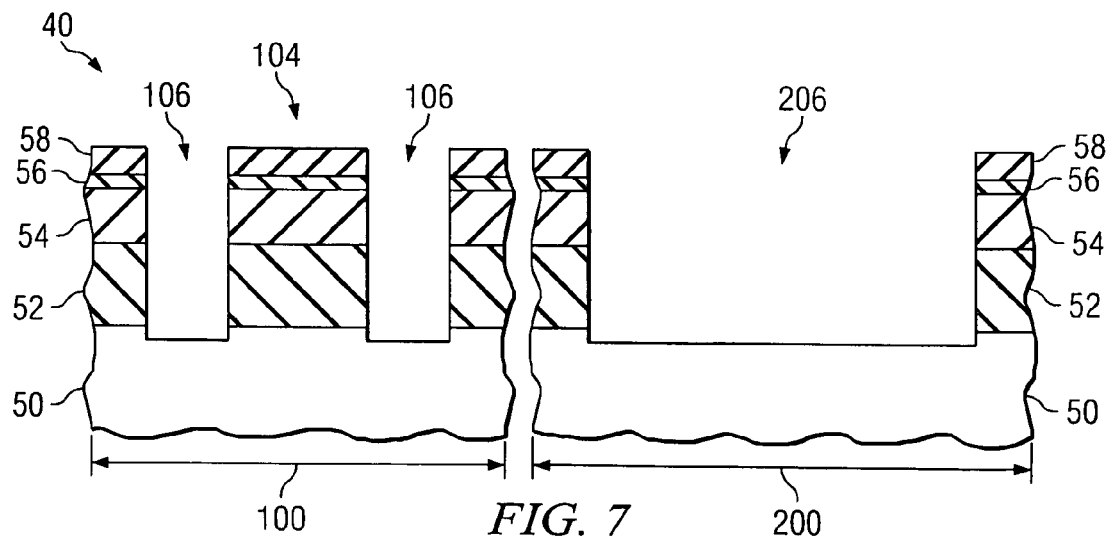

FIG. 7 illustrates the formation of trenches 106 and 206, which are preferably anisotropically etched through the mask layer 58, pad layer 56, semiconductor layer 54, buried oxide 52 and extending into the semiconductor layer 50. In the preferred embodiment, trenches 106 define a region 104 therebetween, wherein the region 104 is suitable for forming one or more MOSFET(s). The photo resist 60 is then removed.

Figure 8:
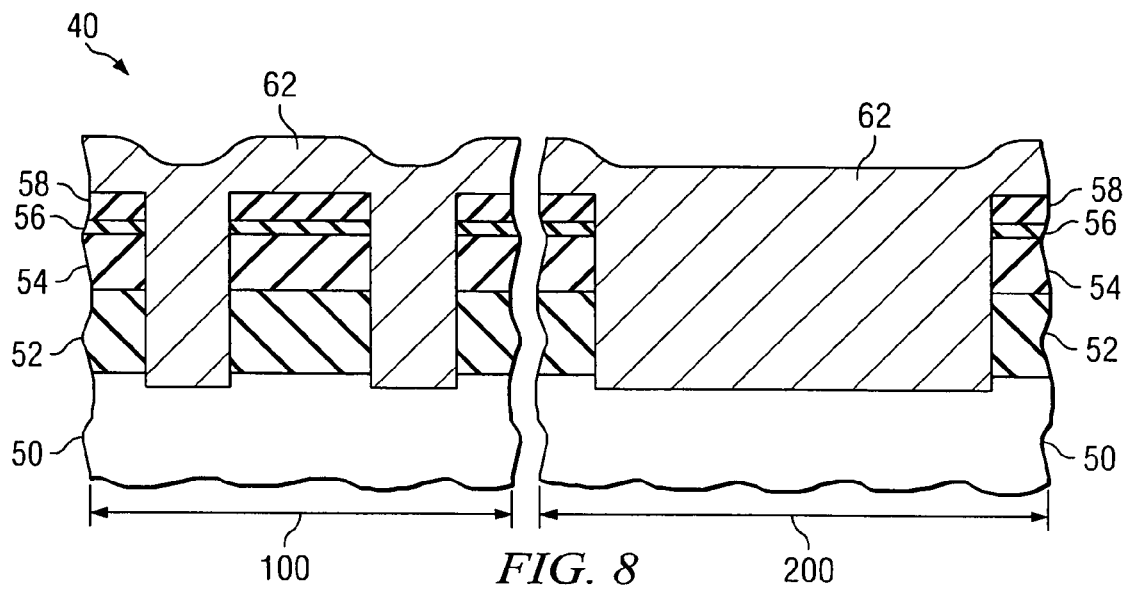
Figure 9:
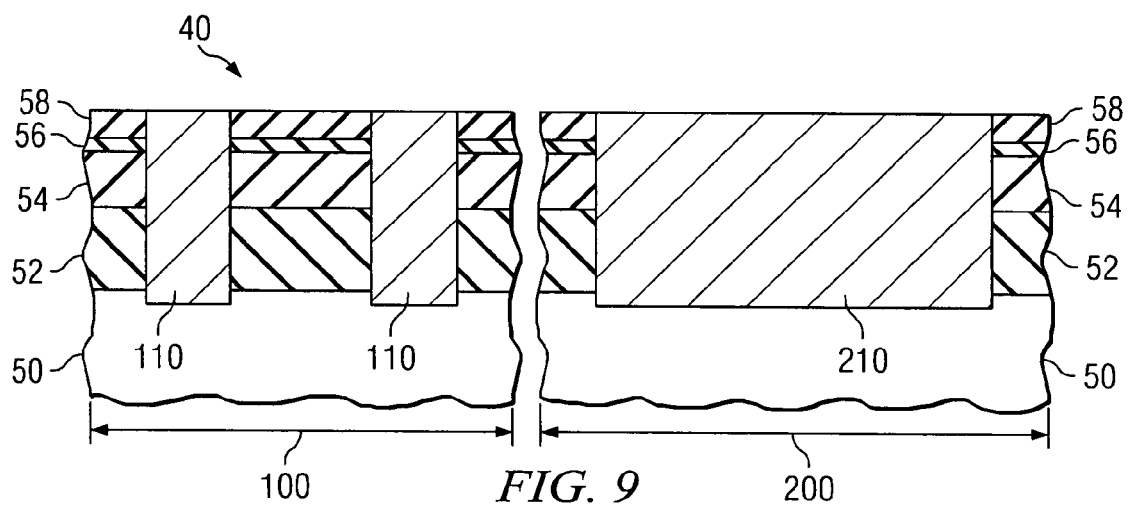

FIG. 8 illustrates the trenches 106 and 206 filled with a dielectric material 62. Preferably, the filling material 62 is silicon oxide formed using high-density plasma (HDP) deposition. Other materials such as silicon nitride or silicon oxynitride may also be used. A chemical mechanical polish (CMP) is performed to remove excess dielectric material 62 and a structure as shown in FIG. 9 is formed. The remaining portion of the dielectric material 62 forms isolation structures 110 and 210, also referred to as shallow-trench-isolation (STI) regions 110 and 210.

Figure 10:
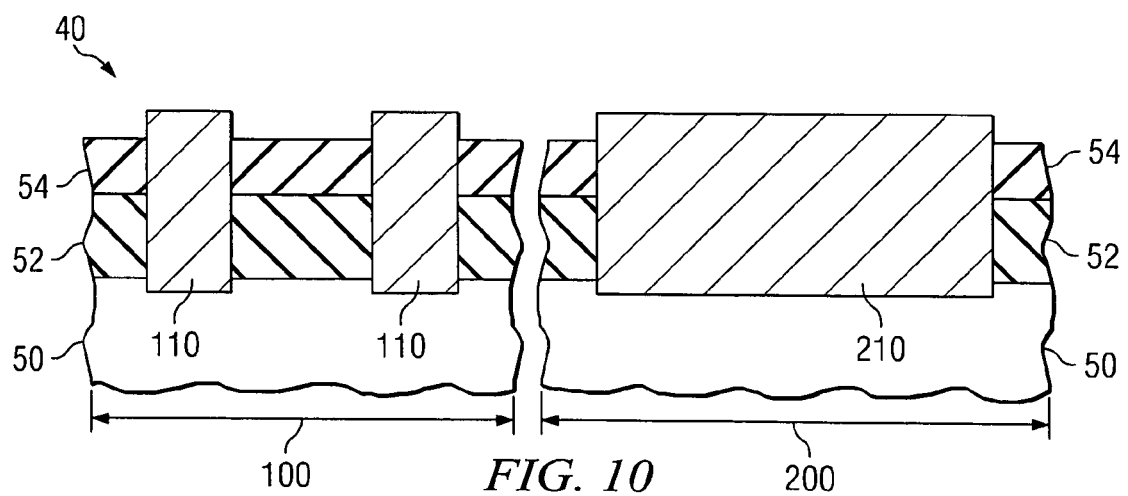

FIG. 10 illustrates a selective etching removing the mask layer 58 and pad layer 56. As a result, the STI regions 110 and 210 may be higher than the semiconductor layer 54. However, the heights of STI regions 110 and 210 will eventually be lowered by subsequent cleaning processes.

Figure 11:
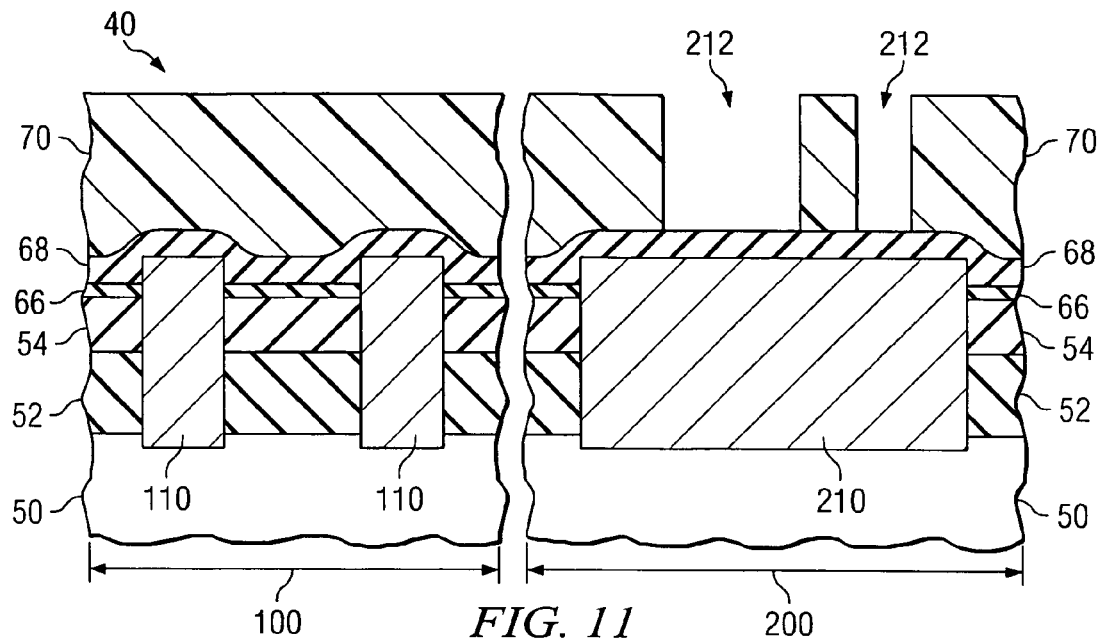

In FIG. 11, an optional pad layer 66, a hard mask layer 68, and a photo resist 70 are formed on the previously formed structures, and openings 212 are formed by patterning the photo resist 70. The pad layer 66 and mask layer 68 are preferably formed of similar materials using similar methods as used for forming the pad layer 56 and mask layer 58 (refer to FIG. 6), respectively. Although the preferred embodiment illustrates two openings 212, one or more openings can be formed simultaneously.

Figure 12:
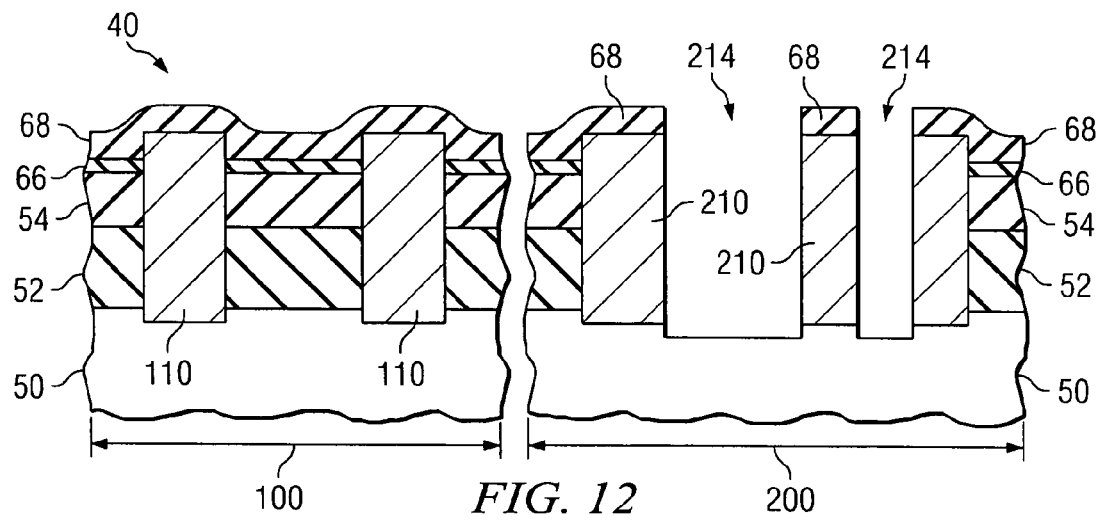

FIG. 12 illustrates the formation of trenches 214, which are etched anisotropically through the mask layer 68 and pad layer 66, using similar etchants and methods for etching the mask layer 58 and pad layer 66, respectively. The STI region 210 is etched through. Preferably, semiconductor layer 50 is used as an etch stop layer for etching the STI region 210, and is exposed through the trenches 214. The photo resist 70 is then removed.

Figure 13:
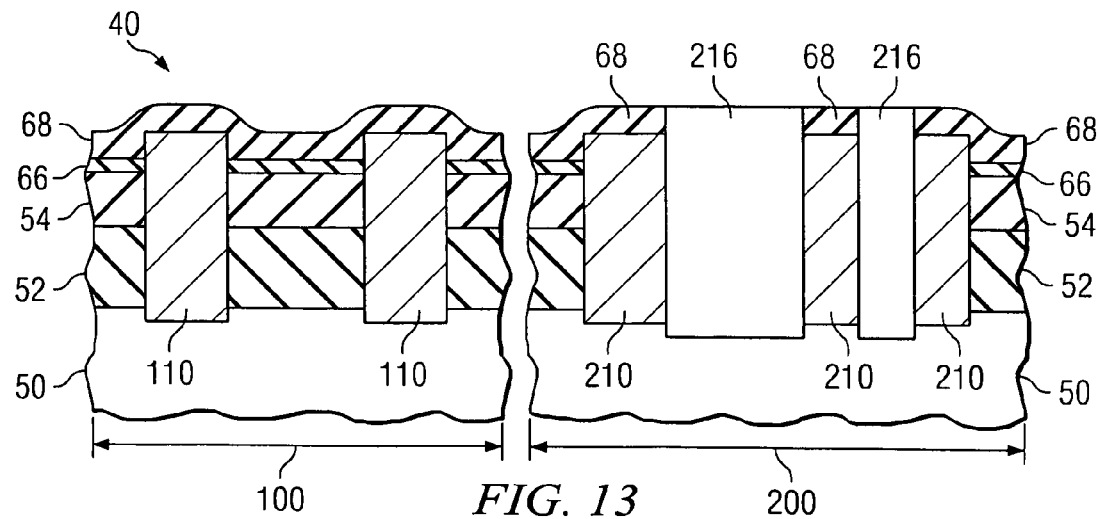

A selective epitaxial growth is then performed, growing a semiconductor material 216 in the trench 214, as illustrated in FIG. 13. Preferably, the semiconductor material 216 has characteristics similar to the semiconductor layer 50. More preferably, the semiconductor material 216 comprises the same material as the semiconductor layer 50. Impurities can be doped when the semiconductor material 216 is grown. Due to the epitaxial growth, the semiconductor material 216 has the same crystal orientation as the semiconductor layer 50. The STI 210 ensures that the epitaxial growth is from the semiconductor material 50 only, i.e., no epitaxial material grows from exposed sidewalls of the semiconductor layer 54. It is desired that the top surface of the semiconductor material 216 is at a same level as the top surface of the semiconductor layer 54. However, due to process difficulty, it is also preferred that the semiconductor material 216 is grown higher than the hard mask layer, and a CMP is performed to remove excess semiconductor material 216.

Figure 14:
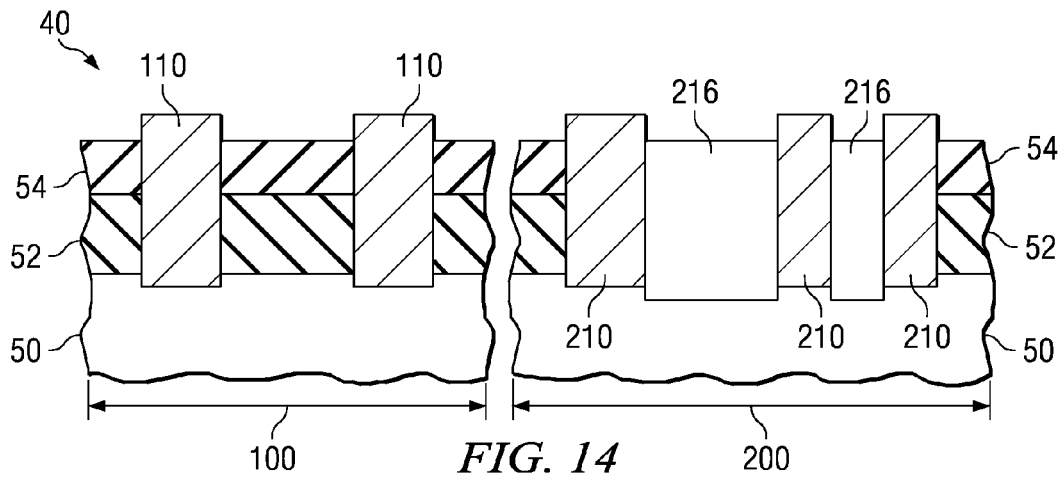

FIG. 14 illustrates a structure after the removal of the mask layer 68 and pad layer 66. In the region 200, the semiconductor material 216 has the same crystal orientation as the semiconductor layer 50, such as in a (110) direction. In the region 100, the semiconductor layer 54 is in a different orientation, such as in a (100) direction. Therefore, NFET and PFET devices can be formed in regions 100 and 200, respectively.

Figure 15:
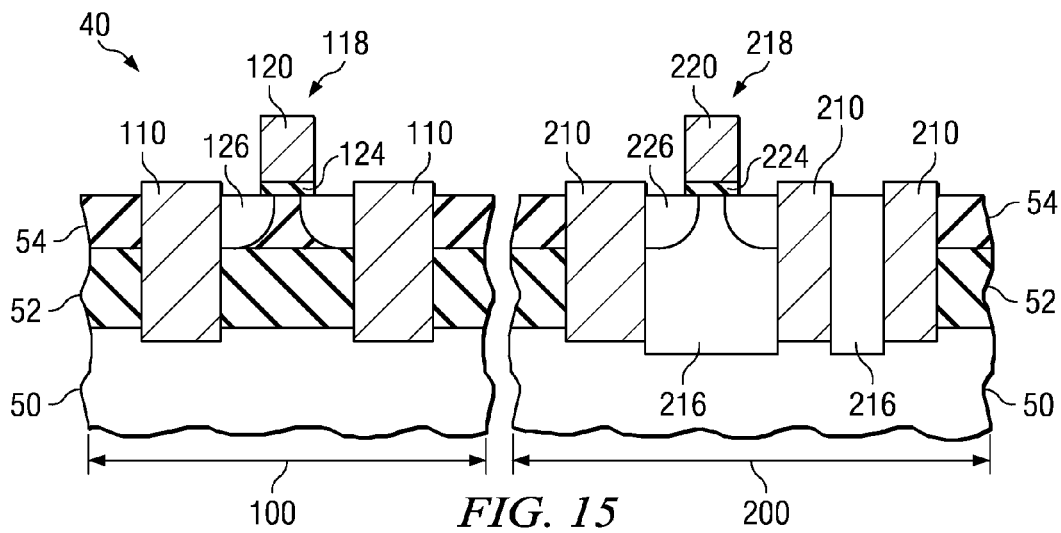

FIG. 15 illustrates the formation of an exemplary NFBT 118 in region 100 and an exemplary PFET 218 in region 200. In the preferred embodiment, a dielectric layer, preferably having a high k value, is formed in both the regions 100 and 200. A gate electrode layer is formed on the dielectric layer. The dielectric layer and gate electrode layer are then patterned to form gate dielectrics 124 and 224, and gate electrodes 120 and 220, respectively.

Regions 100 and 200 are then masked separately to form source/drain regions 126 and 226, respectively. The formation of the source/drain regions is well known in the art, and therefore is not discussed in detail.

The NFET 118 and PFET 218 are therefore formed on silicon surfaces along (100) and (110) orientations, respectively, and performance for both devices is improved.

Figure 16:
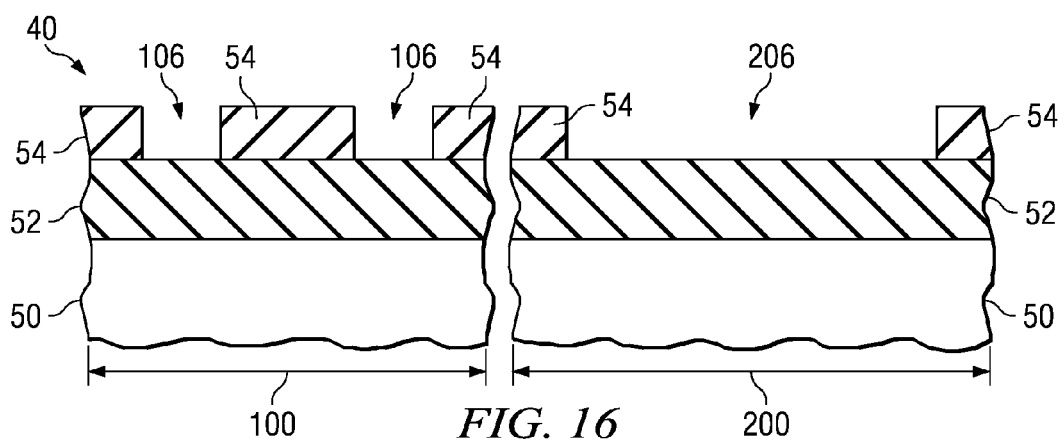
FIGS. 16 through 19 are cross-sectional views of intermediate stages in the manufacture of another preferred embodiment of the present invention.

FIGS. 16 through 19 illustrate another preferred embodiment of the present invention. Certain process steps and materials, such as forming pad layers, mask layers, and photo resists that are used for forming trenches and CMP, are similar to, and have been discussed in detail in, the previously discussed embodiment. One skilled in the art will realize these steps although they are omitted. FIG. 16 illustrates a resulting structure after the formation of the trenches 106 and 206. When etching the trenches 106 and 206, the BOX 52 is used as an etch stop layer, and is exposed through the bottom of the trenches 106 and 206. The etching of the trenches 106 and 206 is controlled precisely as the BOX 52 has significantly different etching characteristics from the semiconductor layer 54. Also, only one material (semiconductor layer 54) needs to be etched, so that the etching process is less complex than when etching multiple layers.

Figure 17:
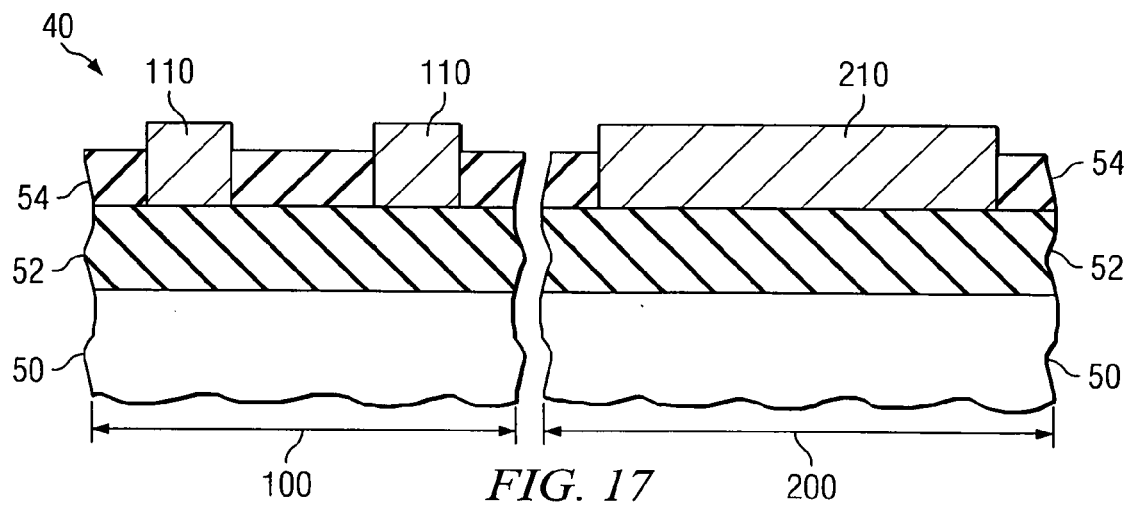
Figure 18:
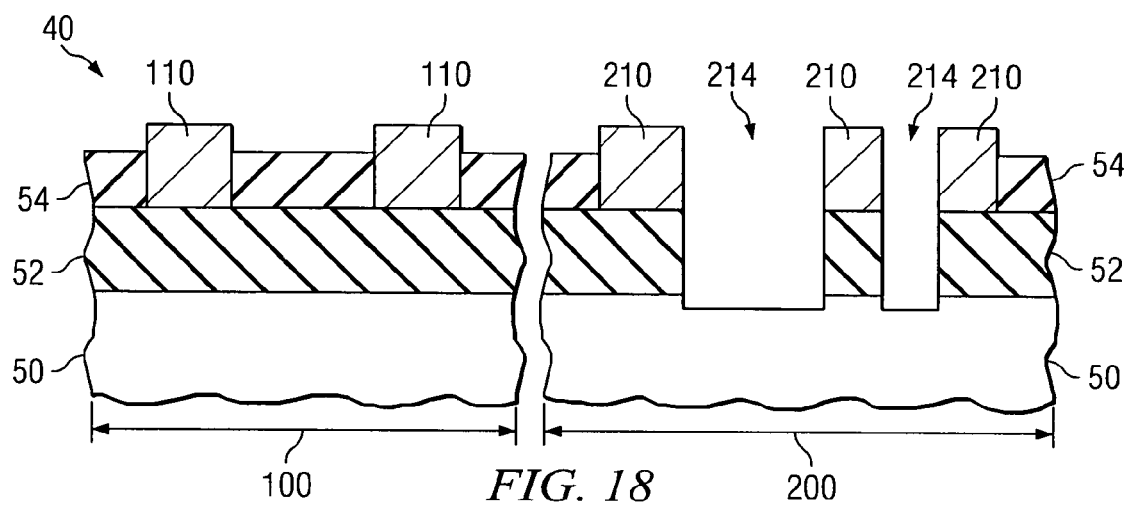
Figure 19:
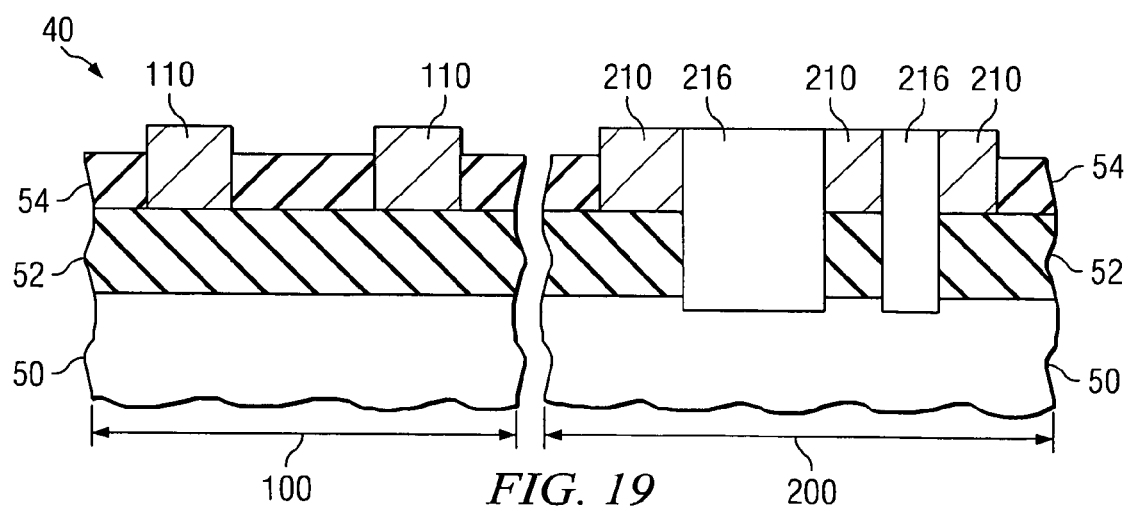

FIG. 17 illustrates a structure after the formation of the isolation structures 110 and 210. The isolation structures 110 and 210 preferably have etching characteristics similar to the BOX 52. More preferably, the isolation structures 110 and 210 and BOX 52 are formed of the same material. In the subsequent formation of the trenches 214, as shown in FIG. 18, the isolation structure 210 and BOX 52 are etched through, and the semiconductor layer 50 is exposed through the trenches 214. FIG. 19 illustrates a structure after the semiconductor material 216 is epitaxially grown in trenches 214. The resulting substrate 40, therefore, has a hybrid crystal orientation, and NFET and PFET devices can be formed on semiconductor layer 54 and epitaxially grown semiconductor material 216.

The preferred embodiments of the present invention have several advantageous features. Firstly, a substrate having a hybrid crystal orientation is formed, and the devices formed thereon can have improved performance for different device types. Secondly, the preferred embodiments of the present invention are highly scalable, as no spacers are required. Thirdly, the manufacturing cost is relatively low. The STI regions that are used for isolating MOSFET devices are formed simultaneously with the STI regions for isolating epitaxial growth. Therefore, less additional cost is introduced for forming the hybrid substrate.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure comprising:
   providing a substrate comprising a buried oxide (BOX) on a first semiconductor layer, and a second semiconductor layer on the buried oxide, wherein the first and second semiconductor layers have a first and a second crystal orientation, respectively, and wherein the substrate comprises a first region and a second region;
   forming a first isolation structure in the second region, wherein the first isolation structure extends through the second semiconductor layer and the BOX to the first semiconductor layer;
   forming a hard mask in the first and second regions, wherein the hard mask is over the first isolation structure;
   forming and patterning a photo resist on the hard mask;
   forming a first trench by etching the hard mask and the first isolation structure, until the first semiconductor layer is exposed through the first trench; and
   epitaxially growing a semiconductor material in the first trench.

2. The method of claim 1 wherein the step of providing the substrate comprises bonding a first substrate including the second semiconductor layer to a second substrate including the first semiconductor layer and the buried oxide.

3. The method of claim 1 wherein the first and second semiconductor layers comprise silicon, and wherein one of the first and second semiconductor layers is in a (100) direction, and the other is in a (110) direction.

4. The method of claim 1 wherein the step of forming the first isolation structure in the second region comprises:
   forming an additional hard mask over the substrate;
   forming and patterning an additional photo resist on the additional hard mask;
   forming an additional trench by etching the additional hard mask, the second semiconductor layer, and the BOX, until the first semiconductor layer is exposed through the additional trench;

filling the additional trench with a dielectric material; and
planarizing the dielectric material.

5. The method of claim 4 further comprising forming a pad layer between the additional hard mask and the second semiconductor layer.

6. The method of claim 1 further comprising forming a second isolation structure in the first region simultaneously with the step of forming the first isolation structure, wherein the second isolation structure extends through the second semiconductor layer to contact the first semiconductor layer.

7. The method of claim 1 further comprising forming a first field effect transistor (FET) in the first region and a second FET in the second region.

8. The method of claim 7 wherein the first and second semiconductor layers comprise silicon, and wherein the first semiconductor layer is in a (110) orientation, and the second semiconductor layer is in a (100) orientation, and wherein the first FET is an NFET, and the second FET is a PFET.

9. The method of claim 1 wherein the semiconductor material grown in the first trench comprises a same material as the first semiconductor layer.

10. The method of claim 1 wherein the semiconductor material grown in the first trench further comprises an impurity.

11. The method of claim 1, wherein after the step of epitaxially growing the semiconductor material, the semiconductor material substantially fills an entirety of the first trench.

12. A method of forming a semiconductor structure comprising:
    providing a substrate comprising a first region and a second region, wherein the substrate comprises:
        a first semiconductor layer having a first crystal orientation;
        a buried oxide (BOX) on the first semiconductor layer; and
        a second semiconductor layer on the BOX, wherein the second semiconductor layer has a second crystal orientation different from the first crystal orientation;
    forming a first hard mask over the substrate;
    forming and patterning a first photo resist on the hard mask;
    forming a first trench in the first region and a second trench in the second region by etching the first hard mask, the second semiconductor layer, and the BOX, until the first semiconductor layer is exposed through the first and second trenches;
    removing the first photo resist;
    filling the first and second trenches with a dielectric material, wherein the dielectric material substantially fills entireties of the first and second trenches;
    planarizing the dielectric material, thus forming a first isolation structure in the first region and a second isolation structure in the second region;
    removing the first hard mask;
    forming a second hard mask over the first and second regions;
    forming and patterning a second photo resist on the second hard mask;
    forming a third trench in the second region by etching the second hard mask and the second isolation structure, wherein the first semiconductor layer is exposed through the third trench;
    removing the second photo resist;
    epitaxially growing a semiconductor material in the third trench; and
    removing the second hard mask.

13. The method of claim 12 further comprising forming a first FET of a first type in the first region, and forming a second FET of a second type in the second region wherein the second type is different from the first type.

14. The method of claim 13 wherein the first and second semiconductor layers comprise silicon, and wherein the first semiconductor layer is in a (110) orientation, and the second semiconductor layer is in a (100) orientation, and wherein the first FET is an NFET, and the second FET is a PFET.

* * * * *